(12) United States Patent
Carter et al.

(10) Patent No.: US 7,005,196 B1
(45) Date of Patent: Feb. 28, 2006

(54) ORGANIC LIGHT-EMITTING DEVICES

(75) Inventors: Julian Charles Carter, Cambridge (GB); Jeremy Henley Burroughes, Cambridge (GB); Stephen Karl Heeks, Cambridge (GB)

(73) Assignee: Cambridge Display Technology Limited, Cambridge (GB)

( * ) Notice: Subject to any disclaimer, the term of this patent is extended or adjusted under 35 U.S.C. 154(b) by 0 days.

(21) Appl. No.: 09/868,351

(22) PCT Filed: Dec. 15, 1999

(86) PCT No.: PCT/GB99/04150

§ 371 (c)(1),
(2), (4) Date: Oct. 2, 2001

(87) PCT Pub. No.: WO00/36662

PCT Pub. Date: Jun. 22, 2000

(30) Foreign Application Priority Data

Dec. 16, 1998  (GB) .................................... 9827699
Mar. 26, 1999  (GB) .................................... 9907120

(51) Int. Cl.
  *H05B 33/14*  (2006.01)
(52) U.S. Cl. ...................... 428/690; 428/917; 313/503; 313/506; 315/169.3
(58) Field of Classification Search ................ 428/690, 428/917; 313/505, 506, 503; 257/40, 93, 257/90; 250/500; 315/169.3, 169.4, 169.1
See application file for complete search history.

(56) References Cited

U.S. PATENT DOCUMENTS 4,647,813 A * 3/1987 Kitabayashi et al. ........ 313/509

| | | | |
|---|---|---|---|
| 5,314,207 A | * | 5/1994 | Camfield et al. ........... 280/828 |
| 5,482,896 A | * | 1/1996 | Tang .......................... 437/209 |
| 5,483,120 A | * | 1/1996 | Murakami ................... 313/506 |
| 5,530,269 A | * | 6/1996 | Tang .......................... 257/88 |

(Continued)

FOREIGN PATENT DOCUMENTS

EP           0822603 A2    2/1998

(Continued)

OTHER PUBLICATIONS

Gyoutoku et al., "Organic Electroluminescent Dot-Matrix Display Using Carbon Underlayer," Proceedings of the 1997 International Conference on Electroluminescence of Molecular Materials and Relaxed Phenomena, Fukuoka, Japan, May 1-24, 1997, vol. 91, no. 1-3, May 21, 1997, pp. 73-75, XP000890057; Synth Met; Synthetic Metals, Dec. 1997, Elsevier Science S.A., Lausanne, Switzerland, pp. 73-75, paragraph 3.

(Continued)

*Primary Examiner*—Rena Dye
*Assistant Examiner*—Camie S. Thompson
(74) *Attorney, Agent, or Firm*—Kudirka & Jobse, LLP (57) ABSTRACT

An organic light-emitting device comprising a light-emissive organic layer (8) interposed between first (4) and second (12) electrodes for injecting charge carriers into the light-emissive organic layer (8), at least one of said first and second electrodes comprising a plurality of layers including a first electrode layer (10) having a high resistance adjacent the surface of the light-emissive organic layer (8) remote from the other of the first and second electrodes, said first electrode layer (10) comprising a high-resistance material selected from the group consisting of a mixture of a semiconductor material with an insulator material, a mixture of a semiconductor material with a conductor material and a mixture of an insulator material with a conductor material.

4 Claims, 3 Drawing Sheets

U.S. PATENT DOCUMENTS

| | | | | |
|---|---|---|---|---|
| 5,739,545 A | * | 4/1998 | Guba et al. | 257/40 |
| 5,776,622 A | * | 7/1998 | Hung et al. | 428/690 |
| 5,798,170 A | * | 8/1998 | Zhang et al. | 428/212 |
| 5,821,539 A | * | 10/1998 | Matz et al. | 250/370.01 |
| 5,920,080 A | * | 7/1999 | Jones | 257/40 |
| 6,091,078 A | * | 7/2000 | Codama | 257/40 |
| 6,416,885 B1 | * | 7/2002 | Towns et al. | 428/690 |
| 6,566,676 B1 | * | 5/2003 | Kuwabara | 250/591 |

FOREIGN PATENT DOCUMENTS

| | | | |
|---|---|---|---|
| EP | 0901176 A2 | | 3/1999 |
| EP | 0903964 A1 | | 3/1999 |
| JP | 03-008375 | | 1/1991 |
| JP | 04-014794 | | 1/1992 |
| JP | 04-276668 | | 10/1992 |
| JP | 08-008065 | * | 1/1996 |
| JP | 09-260062 | | 10/1997 |
| WO | WO 96/26830 | | 9/1996 |
| WO | WO 96/29747 | | 9/1996 |
| WO | WO 97/32452 | | 9/1997 |

OTHER PUBLICATIONS

Jabbour et al., "Aluminum Based Cathode Structure For Enhanced Electron Injection Inelectroluminescent Organic Devices," Applied Physics Letters, us, American Institute of Physics, New York, vol. 73, No. 9, Aug. 31, 1998, pp. 1185-1187, XP000781203, ISSN: 0003-6951 abstract.

Copy of Japanese office action dated Nov. 21, 2003 and Dec. 2, 2003 in corresponding Japanese Application 2000-588818.

* cited by examiner

ORGANIC LIGHT-EMITTING DEVICES

FIELD OF THE INVENTION

This invention relates to organic light-emitting devices (OLEDs) and a method for improving the uniformity of current density of OLEDs having a light-emissive organic layer containing intrinsic defects.

The present invention also relates to organic light-emissive devices having patterned electrodes.

BACKGROUND TO THE INVENTION

Organic light-emitting devices such as described in U.S. Pat. No. 5,247,190 or in U.S. Pat. No. 4,539,507, the contents of which are incorporated herein by reference, have great potential for use in various display applications. According to one method, an OLED is fabricated by coating a glass or plastic substrate with a transparent first electrode (anode) such as indium tin oxide (ITO). At least one layer of a thin film of an electroluminescent organic material is then deposited prior to a final layer which is a film of a second electrode (cathode) which is typically a metal or alloy.

In many practical applications, the layer of electroluminescent organic material has a thickness of the order of 100 nm in order to ensure a practical operating voltage. It is typically deposited on the first electrode by a spin-coating technique. If the organic material is contaminated with particles having a size of the order of the thickness of the organic layer, not only will these particles themselves give rise to defects in the resulting organic layer, their presence disrupts the movement of the fluid organic material over the surface of the first electrode layer leading to variations in the thickness of the resulting organic layer about the particle, and in the worst case leading to the formation of holes in the organic layer through which the underlying layer (electrode layer) is exposed.

Defects in the organic layer can also be caused by, for example, inherently poor film-forming properties of the organic material, or by physical damage to the organic layer after deposition.

Figure 3:
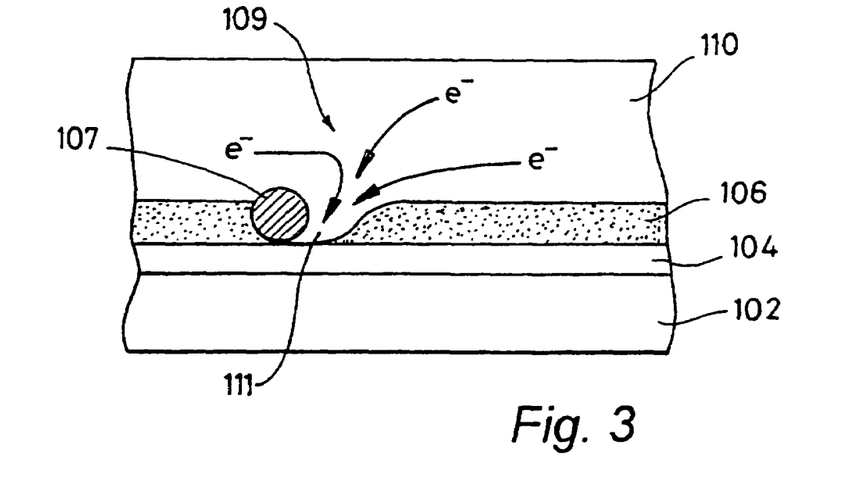
FIG. 3 is a schematic cross-sectional view of an OLED having a typical defect site caused by particulate contamination of the organic material during spin-coating.

A typical defect site is shown in FIG. 3. The electroluminescent organic layer 106 has been deposited by spin coating on a glass substrate 102 coated with an indium tin oxide (ITO) anode layer. The existence of a large particle 107 has led to a defect site 109 comprising the particle 107 itself and a pinhole 111. A cathode layer 110 is formed over the electroluminescent organic layer 106.

Localised defects of the kind shown in FIG. 3 can manifest themselves during device operation as a current anomaly (short) where a large proportion of the current becomes localised in the area of the defect. This leads, inter alia, to problems of device reproducibility and is a particular problem in dot matrix devices since it provides alternative current paths that lead to the wrong pixels being lit.

In order to prevent these kind of defects, the deposition of the organic layer is typically carried out in a clean room with a view to preventing contamination and typically involves filtering the organic material prior to spinning to remove large particles therefrom. However, a typical clean room has particle size levels specified down to 300 nm and the organic material is only typically filtered to about 450 nm, since the elimination of particles having smaller sizes requires great expense.

The light-emissive organic material will therefore often still be contaminated with particles having a size of the order of the thickness of the organic layer to be deposited, which will, as mentioned above, lead to defects in the resulting organic layer. Furthermore, even if the contamination by such large particles could be completely eliminated, defects can still arise during the manufacturing process as a result, for example, of inherently poor film-forming properties of the organic material itself, or due to physical damage inadvertently inflicted on the organic layer after deposition.

One known technique of removing the defect particles after production of the device is by passing a very high current through the device to "burn-out" the defect particles by vaporizing them. However, this technique is not applicable to all defect particles and cannot be used to resolve the problem of large shorts. Moreover, it does not necessarily deal with problems that may manifest themselves in the lifetime of the device. It is therefore an aim of the present invention to reduce the problem of current anomalies in an organic light-emitting device.

In organic light-emissive devices (OLED's) such as those described in our earlier U.S. Pat. No. 5,247,190 or in Van Slyke et al.'s U.S. Pat. No. 4,539,507, light emission from the at least one organic layer occurs only where the cathode and the anode overlap and therefore pixelation and patterning is achieved simply by patterning the electrodes. High resolution is readily achieved and is principally limited only by the overlap area of the cathode and the anode and thus by the size of the cathode and the anode. Dot-matrix displays are commonly fabricated by arranging the cathode and the anode as perpendicular arrays of rows and columns, with the at least one organic layer being disposed therebetween.

Low resolution dot-matrix displays can, for example, be fabricated by coating at least one organic electroluminescent layer onto a substrate having thereon an array of indium-tin oxide (ITO) lines which act as an anode. A cathode comprising an array of lines perpendicular to those of the anode is provided on the other side of the at least one organic layer. These cathode lines may, for example, be lines of aluminium or an aluminium-based alloy which can be evaporated or sputtered through a physical shadow mask. However, shadow masking may not be desirable for various reasons. In particular, there are significant constraints on the use of shadow masks when displays of large area and/or high resolution are required. In order to produce such electrode line arrays and other patterns of large area and/or high resolution one would normally have to use various forms of lithography.

In order to fabricate efficient and stable OLED's with the desired electrical and light output characteristics great care must normally be taken in the design and construction of the interfaces between any organic layer and the electrodes. The particular importance of these interfaces is due to the fact that charge carriers should be injected efficiently from the electrodes into the at least one organic layer.

Maintaining the desired electrical and light output characteristic of the pixels in an OLED display when lithographic processes are used to fabricate the electrode patterns, in particular where those patterns are on top of the at least one organic layer, is not trivial owing to the risk of the lithographic processes modifying and potentially damaging the organic layer/electrode interfaces and the vicinity. Such damage during lithography may originate from the photoresist, the developers, the etching processes (both dry and wet, negative and positive techniques and etch and lift-off) or the solvents used. It should be mentioned here that conjugated polymers are often deposited from and are generally soluble in organic solvents.

Plasma etching/ashing is very often used in lithography to remove the photoresist or residual photoresist which may not have been washed off the developer. Organic electroluminescent and charge transporting materials would normally be damaged, modified and/or etched very rapidly in such dry etching/ashing processes if directly exposed to the plasma.

One method of protecting the organic electroluminescent and charge transporting materials from the effects of the electrode patterning processes is disclosed in WO97/42666 in which a thin barrier layer composed of a dielectric material is interposed between the conductive electrode layer and the layer of light-emissive organic material.

The inventors of the present invention have identified the requirement for an improved construction which allows for the use of various lithographic processes to form the electrode on top of at least one organic layer without significantly changing the electrical and light output characteristics of the display, and which meets todays demands for increased efficiency, reliability and durability. It is therefore another aim of the present invention to provide a device which meets these requirements.

SUMMARY OF THE INVENTION

According to a first aspect of the present invention there is provided an organic light-emitting device comprising a light-emissive organic layer interposed between first and second electrodes for injecting charge carriers into the light-emissive organic layer and means for limiting the current flow through any conductive defect in said light-emissive organic layer. In contrast to the "burn out" technique referred to above, the incorporation into the device of means for limiting the current flow through any conductive defect in the light-emissive layer prevents any current anomalies arising during the lifetime of the device from rising to such a level as to significantly affect device operation in the manner described above.

Preferably the means are incorporated into at least one of said first and second electrodes of the device. In particular, the electrode may comprise a plurality of layers including a first electrode layer adjacent the surface of the light-emissive organic layer remote from the other of the first and second electrodes and having a resistance selected such that it is not too high to cause a significant increase in the drive voltage of the device, yet high enough to prevent excessive currents at any conductive defect in said light-emissive organic layer.

According to one embodiment of the invention, the first electrode layer may comprise a high-resistance material selected from the group consisting of a mixture of a semiconductor material with an insulator material, a mixture of a semiconductor material with a conductor material and a mixture of an insulator material with a conductor material. The use of a layer of the above-mentioned mixtures of materials as the high resistance electrode layer has the advantage that the resistance of the high resistance electrode layer can be easily adjusted to the desired value by simply adjusting the relative proportions of the components of the mixture accordingly.

In the case of a cathode, the first electrode layer preferably comprises at least one material having a low work function, preferably less than 3.7 eV, and further preferably less than 3.2 eV, to improve the electron-injecting performance of the cathode.

According to a second aspect of the present invention, there is provided an organic light-emitting device comprising a light-emissive organic layer interposed between first and second electrodes for injecting charge carriers into the light-emissive organic layer and means for electrically isolating any conducting defect in the organic layer from an associated electrode. Any current anomalies arising during the lifetime of the device according to this aspect of the invention are short-lived the conducting defect in the organic layer giving rise to the current anomaly is rapidly isolated from the associated electrode by means incorporated in the device.

These means are preferably incorporated into at least one of said first and second electrodes, which may comprise a plurality of layers including a thin first electrode layer adjacent the surface of the light-emissive organic layer remote from the other of the first and second electrodes, the dimensions and material properties of said thin first electrode layer being chosen such that, adjacent a conducting defect in said organic layer, said layer will vapourise when subject to an anomalous current resulting from said conducting defect.

According to one embodiment of the invention, the electrode is opaque and comprises a plurality of layers including a thin first electrode layer comprising a low work function material adjacent the surface of the light-emissive organic layer remote from the other of the first and second electrodes, and a second electrode layer adjacent the surface of the first electrode layer remote from the light-emissive organic layer, said second electrode layer comprising a layer of a high-resistance material selected from the group consisting of a semiconductor material, a mixture of a semiconductor material with an insulator material, a mixture of a semiconductor material with a conductor material and a mixture of an insulator material and a conductor material.

Alternatively, the electrode may have a first electrode layer comprising a plurality of sub-electrodes, each sub-electrode being connected to each of any sub-electrodes directly surrounding it via a fusible link, each fusible link adapted to break when subject to a current exceeding a specified value to electrically isolate the respective sub-electrode from the other sub-electrodes.

The thin first electrode layer in this second aspect of the present invention preferably has a thickness in the range of 0.5 to 10 nm, and is further preferably 5 nm or less.

According to a third aspect of the present invention, there is provided an organic light-emitting device comprising a light-emissive organic layer interposed between first and second electrodes for injecting charge carriers into the light-emissive organic layer, at least one of said first and second electrodes comprising a plurality of layers including a first electrode layer having a high resistance, said first electrode layer having a thickness greater than the light-emissive organic layer, such that any intrinsic defects in the light-emissive organic layer are covered by the first electrode layer.

According to one embodiment, the first electrode layer is disposed adjacent the surface of the light-emissive organic layer remote from the other of the first and second electrodes.

By making the thickness of the high resistance first electrode layer greater than that of the light-emissive organic layer, any pinhole defects in the light-emissive organic layer are completely filled making it possible to further ensure that there are no areas of the light-emissive organic layer left exposed to make direct contact with an overlying conductive layer.

The high resistance layer in this third aspect of the invention preferably comprises a semiconductor material, a mixture of a semiconductor material with a conductor material, a mixture of a semiconductor material with an insulator material or a mixture of a conductor material with an insulator material.

According to a fourth aspect of the present invention, there is provided a method for improving the uniformity of current density of an organic light-emitting device comprising a light-emissive organic layer interposed between first and second electrodes for injecting charge carriers into the light-emissive organic layer, the method comprising the step of forming one of the first and second electrodes from a plurality of layers including a first electrode layer having a high resistance comprising a semiconductor material, a mixture of an insulator material with a semiconductor material, a mixture of an insulator material with a conductor material, or a mixture of a semiconductor material with a conductor material.

In each of the above aspects of the invention, the high-resistance electrode layer is preferably capped with a layer of a conductor material such as a layer of aluminium.

The resistance of the high resistance electrode layer in the first to fourth aspects of the present invention is preferably selected such that it is not too high to cause a significant increase in the drive voltage (since this will reduce the power efficiency of the device) but is high enough to prevent excessive currents at defect sites. Typically for an electrode layer of thickness lying in the range of 100–10000 nm, the resistivity lies in the range 1 to $10^5$ Ωcm.

Suitable semiconductor materials for use in the above aspects of the present invention include, for example, Ge, Si, α-Sn, Se, ZnSe, ZnS, GaAs, GaP, CdS, CdSe, MnS, MnSe, PbS, ZnO, SnO, $TiO_2$, $MnO_2$ and SiC.

Suitable insulator materials for use in the above aspects of the present invention include, for example, insulating oxides, nitrides and fluorides such as $Al_2O_3$, $SiO_2$, LiO, AlN, SiN, LiF and CsF. Suitable conductor materials for use in the present invention include, for example, metals such as Al and Ag.

Suitable low work function materials for use in the present invention include, for example, Ca, Li, Yb, LiF, CsF and LiO.

The use of the cathode to combat the undesirable effects of intrinsic defects in the light-emissive organic layer is particularly advantageous when the cathode is deposited in a vacuum because of the ability to keep particulate levels extremely low.

According to a sixth aspect of the present invention, there is provided a light-emissive device comprising a layer of light-emissive material arranged between first and second electrode layers such that charge carriers can move between the first and second electrode layers and the light-emissive material, wherein at least the first electrode layer comprises a plurality of sub-electrodes, each sub-electrode being connected to each of any sub-electrodes directly surrounding it via a fusible link, each fusible link adapted to break when subject to a current exceeding a specified value to electrically isolate the respective sub-electrode from the other sub-electrodes.

In a preferred embodiment of the sixth aspect of the present invention, the plurality of sub-electrodes are arranged to create an ordered array of parallel rows and columns, and each of the sub-electrodes is connected via a fusible link to each of any sub-electrodes directly adjacent to it in the same column and row.

The size and spacing of the sub-electrodes is preferably selected such that, during operation of the device, the light emitted by the light-emissive device appears to the human eye to be continuous in intensity across the whole area of light emission.

According to a seventh aspect of the present invention there is provided an organic light-emissive device comprising a light-emissive organic region interposed between first and second electrodes for injecting charge carriers into the light-emissive organic region, at least one of said first and second electrodes comprising: a high-resistance first electrode layer adjacent the surface of the light-emissive organic region remote from the other of the first and second electrodes, said first electrode layer covering substantially the entire area of the surface of the light-emissive organic region remote from the other of the first and second electrodes and comprising a high-resistance material selected from the group consisting of a mixture of a semiconductor material with an insulator material, a mixture of a semiconductor material with a conductor material and a mixture of an insulator material with a conductor material; and a patterned conductive second electrode layer adjacent the surface of the first electrode layer remote from the light-emissive organic region.

In the seventh aspect of the present invention, the first electrode layer is, as described above, formed over substantially the entire surface of the light-emissive organic region. In other words, the first electrode layer is formed over at least that area of the surface of the light-emissive organic region corresponding to the area occupied by the second electrode layer as defined by the laterally outermost edges of the patterned second electrode layer.

The term "patterned electrode layer" refers to a plurality of electrode elements which are only connected via the underlying high resistance first electrode layer. The patterned electrode layer preferably comprises an ordered array of separate elements such as a series of parallel rows or columns which are only connected via the underlying high resistance first electrode layer.

The resistance of the high resistance first electrode layer in this seventh aspect of the present invention is determined such that it is sufficiently high to prevent significant current leakage between elements of the patterned second electrode layer, but is not so high as to significantly increase the voltage required to operate the device.

The use of a material comprising a physical blend of an insulator material and a semiconductor material, or a physical blend of a semiconductor material and a conductor material or a physical blend of a conductor material and an insulator material as the barrier layer has the significant advantage that the resistivity of the layer can be readily adjusted in accordance with the requirements of the individual device by appropriately varying the relative proportion of each material in the blend.

The high resistance first electrode layer of this seventh aspect of the present invention is preferably composed of a physical blend of a conductor and an insulator or semiconductor, preferably a physical blend of a conductor and an insulator, since the increased conductivity of the blend realised by the inclusion of a conductor material means that the thickness of the high-resistance first electrode layer can be increased without causing a significant increase in the voltage required to operate the device. This ability to substantially increase the thickness not only provides the possibility to enhance the protection of the underlying organic layer or layers from the effects of etching/ashing processes but also provides the means to compensate for the adverse effects of any defects (such as particles of contamination or pinholes) which inevitably exist in the underlying organic film even with the high degree of cleanliness provided by the modern clean room. For example, covering any such defects substantially reduces the existence of undesirable low-resistance pathways within the device, thereby improving the performance of the device. A barrier layer of increased thickness also provides increased protection of the underlying organic layer against the ingress of reactive ambient species such as moisture and oxygen which can react with the organic material resulting in black spots.

Suitable semiconductor materials include, but are not limited to, Ge, Si, α-Sn, Se, ZnSe, ZnS, GaAs, GaP, CdS, CdSe, MnS, MnSe, PbS, ZnO, SnO, $TiO_2$, $TiO_2$, $MnO_2$ and SiC.

Suitable insulator materials include, but are not limited to, oxides, nitrides and halides such as fluorides. The insulator material is preferably selected from the group consisting of $Al_2O_3$, $SiO_2$, LiO, AlN, SiN, LiF and CsF.

Suitable conductor materials include, but are not limited to, metals, preferably Al or Ag.

According to an embodiment of the seventh aspect of the present invention, the first electrode layer forms the cathode of the device and comprises at least one material comprising an element having a low work function (preferably 3.7 eV or less, and further preferably 3.0 eV or less) such as Li, Ca or Cs whereby the electron injecting performance of the electrode is enhanced. Electrode layers comprising a material including Li or Ca are particularly preferred. The first electrode layer is preferably comprised of a mixture selected from the group consisting of LiF/Al, Ca/Ge, Li/Si, Ca/ZnO, LiF/ZnSe and CsF/ZnS.

According to an alternative embodiment of the seventh aspect of the present invention, the first electrode layer forms the anode of the device and comprises at least one material including an element having a high work function (preferably greater than 4.5 eV and further preferably greater than 5.0 eV) whereby the hole injecting performance of the electrode is enhanced. In this alternative embodiment, it is preferred that the first electrode layer comprises a material selected from the group consisting of Au, Pd, Ag and indium-tin oxide (ITO).

The first electrode layer preferably has a thickness in the range of 0.5 to 1.0 microns, and is composed of a material having a resistivity, $\rho$ in the range of $10^2$ to $10^5$ $\Omega$.cm.

According to an eighth aspect of the present invention, there is provided an organic light-emissive device comprising a light-emissive organic region interposed between first and second electrodes for injecting charge carriers into the light-emissive organic region, at least one of said first and second electrodes comprising a plurality of layers including a high-resistance first electrode layer adjacent the surface of the light-emissive organic region remote from the other of the first and second electrodes, said first electrode layer formed over substantially the entire area of the surface of the light-emissive organic region remote from the other of the first and second electrodes, and having a thickness greater than the light-emissive organic region whereby adverse effects of any defects in the light-emissive organic region are compensated for by the first electrode layer; and a second electrode layer adjacent the surface of the first electrode layer remote from the light-emissive organic region, said second electrode layer comprising a patterned conductive layer.

In this eighth aspect of the present invention, the thickness of the first electrode layer is preferably in the range of 0.5 to 1 micron; and the first electrode layer preferably comprises a material selected from the group consisting of a semiconductor material, a mixture of a semiconductor material and an insulator, a mixture of a semiconductor material and a conductor material and a mixture of an insulator material and a conductor material.

According to a ninth aspect of the present invention, there is provided a method of forming an electrode of an organic light-emissive device comprising a light-emissive organic region interposed between first and second electrodes for injecting charge carriers into the light-emissive organic region, the method comprising forming one of the first and second electrodes by first forming a high-resistance first electrode layer over substantially the entire area of the surface of the light-emissive organic region remote from the other of the first and second electrodes, said first electrode layer comprising a material selected from the group consisting of a semiconductor material, a mixture of a semiconductor material with an insulator, a mixture of a semiconductor material with a conductor material and a mixture of an insulator material with a conductor material; and then forming a second electrode layer on the surface of said first electrode layer remote from the light-emissive organic region, said second electrode layer comprising a patterned conductive layer.

According to a tenth aspect of the present invention, there is provided an organic light-emissive device comprising a light-emissive organic region interposed between first and second electrodes for injecting charge carriers into the light-emissive organic region, at least one of said first and second electrodes comprising: a first electrode layer comprising an insulator material adjacent the surface of the light-emissive organic region remote from the other of the first and second electrodes; a high-resistance second electrode layer adjacent the surface of the first electrode layer remote from the light-emissive organic region; and a patterned conductive third electrode layer adjacent the surface of said second electrode layer remote from the first electrode layer; wherein said first and second electrode layers cover substantially the entire area of the surface of the light-emissive organic region remote from the other of the first and second electrodes; and said second electrode layer comprises a high-resistance material selected from the group consisting of a semiconductor material, a mixture of a semiconductor material with an insulator material, a mixture of a semiconductor material with a conductor material and a mixture of an insulator material with a conductor material.

In this tenth aspect of the present invention, the term "patterned electrode layer" refers to a plurality of electrode elements which are only connected to each other via the underlying electrode layers, and are preferably only connected to each other via the underlying high resistance second electrode layer.

The provision of a thin layer of an insulator material adjacent to the organic light-emissive region as well as an overlying high-resistance electrode layer has the following additional advantage. The charge carrier injecting performance can be further enhanced at the interface between the electrode and the light-emissive organic region by using a material containing a low work function element in the case of a cathode or a material containing a high work function element in the case of an anode without significantly increasing the operating voltage of the device and detracting from the function of the first and second electrode layers as a whole which is to prevent lateral current leakage (crosstalk) as well as protecting the underlying organic region.

In this tenth aspect of the present invention, the first electrode layer preferably comprises a layer of a dielectric oxide, nitride or halide such as a fluoride. Particularly preferred materials for use in the case of cathodes are LiO, LiF and CsF.

In each of the seventh to tenth aspects of the present invention, the light-emissive organic region may, for example, be composed of a single layer of a light-emissive organic material such as a light-emissive polymer, or it may include one or more additional organic layers which may function as additional light-emissive layers or as charge injection and/or transport layers.

BRIEF DESCRIPTION OF THE DRAWINGS

Embodiments of the present invention will now be described, by way of example only, with reference to the accompanying drawings in which:—

DESCRIPTION OF THE PREFERRED EMBODIMENTS

Figure 1:
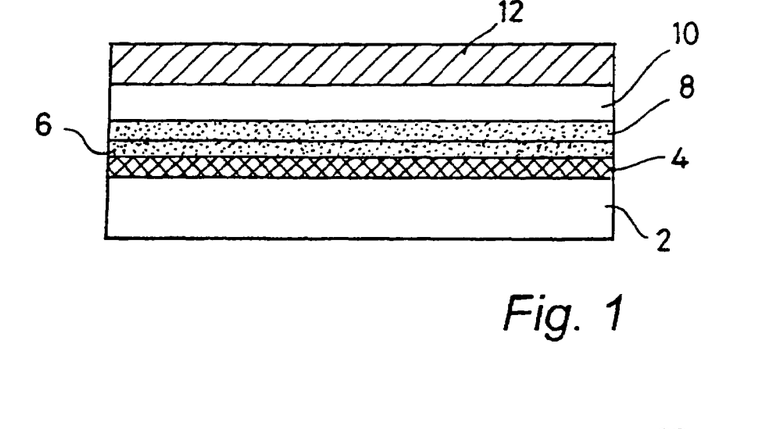
FIG. 1 is a cross-sectional view of an OLED according to an embodiment of the present invention.

FIG. 1 shows an OLED according to a first embodiment of the present invention.

A glass substrate 2 having a thickness of 1.1 mm is coated with a layer 4 of indium tin oxide (ITO) with a sheet resistance of 15 Ohms/sq. to a thickness of 150 nm. Although not shown in FIG. 1, this is patterned to form a series of parallel strips using, for example, standard photolithographic and etch processes. A layer 6 of polyethylenedioxythiophene doped with polystyrene sulphonic acid (PEDT:PSS) is spun on the anode layer 4 and subsequently baked at 150° C. to remove water leaving a layer of 50 nm thickness. A layer 8 of a light-emissive polymer such as a blend of 5% poly(2,7-(9,9,di-n-octylfluorene)-3,6-(benzothiadiazole) with 95% poly(2,7-(9,9-di-n-octylfluorene) (5BTF8) doped with poly(2,7-(9,9-di-n-octylfluorene)-(1,4-phenylene-((1,4-phenylene-((4-secbutylphenyl)imino)-1,4-phenylene)) (TFB) is then spun on to the layer 6 of PEDT:PSS to a thickness of 75 nm. A cathode layer 10 is then formed on the layer 8 of light-emissive polymer.

A standard vacuum thermal evaporation technique is used to deposit the cathode layer in view of the fact that, being a relatively low-energy technique, it causes minimal damage to the underlying layer of light-emissive polymer. If the possibility of damage to the underlying organic layer is not a concern, sputtering is a desirable technique because it is a conformal deposition technique. In the case of sputtering, neon is preferably used as the discharge gas.

In this case, the cathode layer 10 is a layer of LiF co-evaporated with Al. This cathode layer 10 is deposited to a thickness of between 0.5 and 1 micron to ensure that the entire surface of the underlying organic layer, and hence any defects therein, is covered by the cathode layer. A layer 12 of aluminium is deposited on top of this layer to a thickness of 0.5 microns. This top layer of aluminium 12 can, for example, be deposited by evaporation. Although not shown in FIG. 1, the cathode comprising the LiF-Al cathode layer 10 and the aluminium top layer 12 is also patterned in the form of a series of parallel strips running in a direction orthogonal to the series of parallel anode strips, whereby an ordered array of pixels is formed defined by the points at which each series of cathode and anode strips overlap.

The LiF has a dual function. It is a low work function material and therefore assists the injection of electrons into the light-emissive organic layer. It is also an insulator resulting in a layer having a high resistance.

The high-resistance LiF/Al layer conducts via a percolation mechanism.

The relative proportions of LiF and Al in the LiF-Al layer 10 will be determined according to the desired resistivity. The desired resistivity is itself determined according to the number and area of the defects existing in the underlying light-emissive organic layer 8. A method for determining a suitable resistivity is described below with reference to FIG. 2 which shows an OLED comprising a light-emissive organic layer 18 containing a plurality of pinhole defects 30 which are the major cause of current anomalies in OLEDs.

Figure 2:
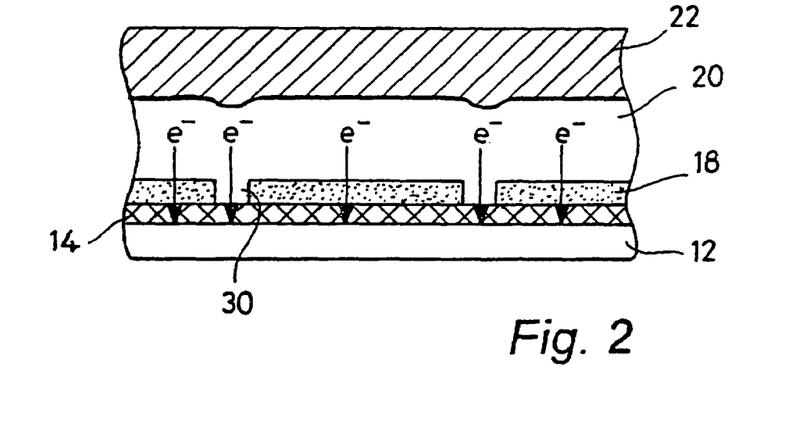
FIG. 2 is a cross-sectional view of an OLED for explaining the principle of one aspect of the present invention.

The light-emissive organic layer 18 is sandwiched between a first cathode layer 20 and an ITO anode layer 14 coated on a glass substrate 12. The first cathode layer is coated with a layer of aluminium 22.

It is supposed, by way of example, that the current density (j) of the device at a typical operating voltage of 3V would be 1 mA/cm$^2$ if the light-emissive organic layer 18 did not contain any pinhole defects.

It is desired that the current density attributable to the existence of the pinhole defects represents only a small proportion of the current density that would be observed if there were no pinholes existing in the light-emissive organic layer. For example, it is preferred that the first cathode layer is of a sufficiently high resistance that the current density attributable to the defects is at most 1% of the current density that would be observed if there were no pinholes existing in the light-emissive organic layer.

The current density through the pinhole defects can be calculated to be:

$j_{(def)} = NVA/\rho t$ where N is the density of defects (per unit area); A is the average area of each defect; V is the operating voltage; p is the resistivity of the cathode layer; and t is the thickness of the first cathode layer 20.

Let us now suppose that the thickness of the first cathode layer 20 is 0.5 microns, and that there are 100 defects each of area 1 $\mu m^2$.

Then, at the operating voltage of 3V mentioned above, the current density attributable to the defects would be approximately 60/$\rho$ mA/cm$^2$.

In order for this current density to represent 1% or less of the current density that would be observed if there were no pinhole defects (which is supposed as above to be 1 mA/cm$^2$), the resistivity of the material of the first cathode layer would have to be about 6000 Ωcm or greater.

The voltage drop across a first cathode layer having a thickness of 0.5 microns and composed of material having a resistivity of 6000 Ωcm would only be about 0.3 mV when the current density is 1 mA/cm$^2$. This layer will therefore have a negligible effect on the power efficiency whilst improving the uniformity of the current density of the OLED in operation.

The existence of particle defects in the light-emissive organic layer have been ignored on the basis that their effect is negligible compared to that of the pinhole defects. However, if the effects of any such defects are not negligible, it will be clear to the skilled person in light of the above how to take the effect of such particle defects into consideration when determining a suitable resistivity for the high resistance cathode layer.

Hereunder is provided a method for calculating the optimum value of resistivity for the high resistance layer for a device of the kind shown in FIG. 1 with defective areas that would, without this high resistance layer, allow direct connection between the low resistance cathode and anode. The film is optimised for maximum efficiency.

For a device with no defects operating at a current density of $I_0$ (mA/cm$^2$) and voltage $V_0$ (Volts) with luminosity $L_0$ (Cd/m$^2$) has a luminous efficiency $\eta_0$ (1m/W) of $$\eta_0 = \frac{\pi L_0}{10 V_0 I_0} \quad (1)$$

If we now introduce defects into the device where the defective area as a ratio of the total area is D and the areal resistance of these defects is $R_D$ (k$\Omega$ cm$^2$), the average current density through the whole device at the same voltage is $$I = (1-D)I_0 + D\frac{V}{R_D}. \quad (2)$$

If we assume that the defective areas do not emit any light then the light emitted by the defective light-emissive organic layer is just given by $$L=(1-D)L_0 \quad (3)$$

If we now introduce a high resistance cathode layer with areal resistivity $R_H$ (k$\Omega$cm$^2$) then to get $I_0$ flowing through the non-defective areas, the voltage across the device needs to be increased to $$V=V_0+I_0 R_H. \quad (4)$$

The average current density flowing through our device is from equation 2

$$I = (1-D)I_0 + D\frac{V}{R_D + R_H}. \quad (5)$$

The new efficiency $\eta 0$ is then given by combining equations 3,4 and 5 to give $$\eta = \frac{\pi(1-D)(R_D + R_H)L_0}{10(V_0 + I_0 R_H)\{(1-D)(R_D + R_H)I_0 + D(V_0 + I_0 R_H)\}}. \quad (6)$$

In general, if the defective areas are a problem then they will have a very low resistance compared to the high resistance layer, i.e.

$$R_D \ll R_H. \quad (7)$$

The efficiency then becomes $$\eta = \frac{\pi(1-D)R_H L_0}{10(V_0 + I_0 R_H)\{(1-D)R_H I_0 + D(V_0 + I_0 R_H)\}}. \quad (8)$$

If we differentiate this with respect to $R_H$ to find the maximum efficiency we find that $$R_H^{MAX} = \frac{\sqrt{D}\, V_0}{I_0}. \quad (9)$$

The value of the high resistance layer that maximises the efficiency at a particular operating point (determined by $I_0$ and $V_0$) depends on the square root of the fractional defective area.

The optimum resistivity of the high resistance layer will depend on the thickness of the high resistance layer which is in turn determined according to the size and shape of the defect causing the short and the method of deposition of the high resistance layer. If the method of deposition is one which covers all surfaces conformally then the high resistance layer can be any thickness. If however the method of deposition is a line of sight method such as evaporation from a fixed source to a fixed target then the thickness has to be, in general, greater than the height of the defect. If the thickness of the high resistance layer is taken to be $t_H$ (in cm) and the optimum resistivity $\rho_H$ then $$\rho_H = \frac{R_H^{MAX}}{t_H}. \quad (10)$$

It is thus clear that the optimum values of thickness and resistivity of the high resistance layer depend on the size of the defective area, the nature of the defect, the deposition method and the operating point of the device.

Figure 4:
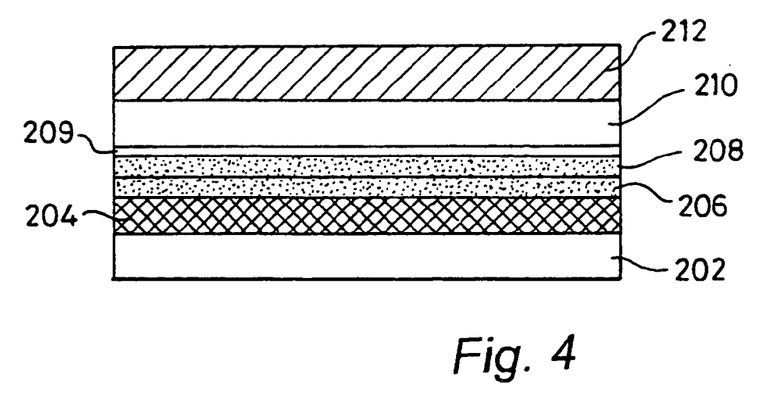
FIG. 4 is a cross-sectional view of an OLED according to another embodiment of the present invention.

FIG. 4 is a cross-sectional view of an organic light-emitting device according to another embodiment of the present invention. The substrate 202, anode layer 204, organic layers 206, 208 are identical to those of the first embodiment described above. A thin layer of calcium 209 having a thickness of 5 nm is formed on the surface of the organic layer 208. This layer 209 is preferably formed by vacuum evaporation. A layer of silicon 210 having a thickness of 0.5 microns is formed on the thin layer of calcium 209 as a high-resistance layer, and a layer of aluminium 212 having a thickness of 0.5 microns is formed on top of the layer of silicon 210.

The use of a thin layer of a conductor material (in this case, calcium) between the high-resistance layer and the light-emissive organic layer is advantageous as it effectively acts as a fuse. If a portion of the thin conductor layer is subject to an anomalously high current as result of a defect in the portion of the organic layer underlying that portion of the thin conductor layer, that portion of the thin conductor layer vapourises thereby stopping current flowing through the conducting defect and improving the performance of the device. The conducting defects can be isolated in this way by passing a high current through the device after production is completed.

Although the embodiments described above are devices having a high-resistance cathode, alternatively a high-resistance anode can be employed in the case, for example, that an OLED is produced by first forming a cathode on a glass substrate, depositing a layer of light-emissive organic material on the cathode by spinning, and finally forming an anode on the light-emissive organic layer. In the case of an anode, it is preferred that the high-resistance electrode layer comprises a high work function material, or that a thin layer of a high work function material is interposed between the high-resistance electrode layer and the light-emissive organic layer.

Figure 5:
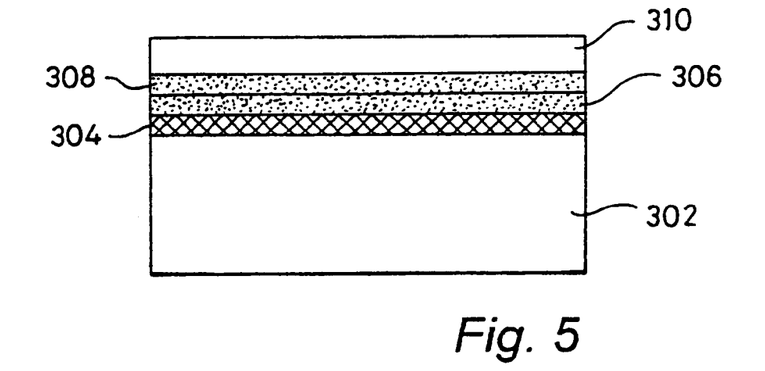
FIG. 5 shows a schematic view of a light-emissive device according to another embodiment of the present invention.
Figure 6:
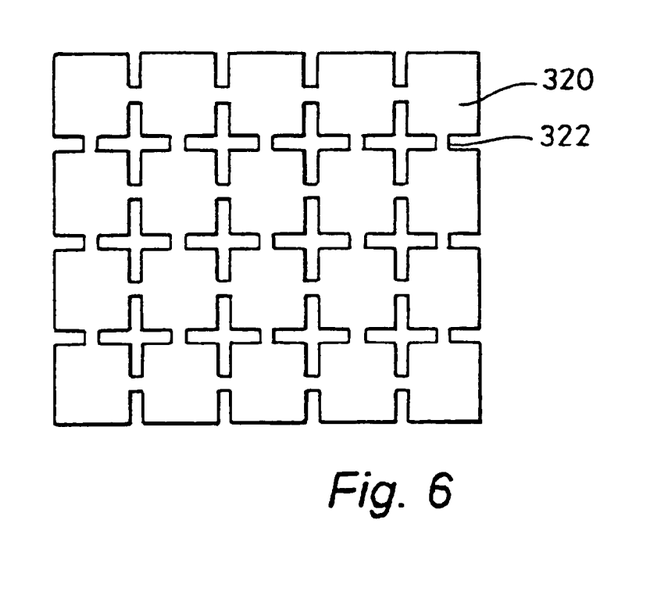
FIG. 6 is a schematic plan view of a section of the anode layer of the device shown in FIG. 5.

With reference to FIG. 5, there is shown a light-emissive device according to the sixth aspect of the present invention for use in the light-emitting display according to the fifth aspect of the present invention. This device is intended for use as a backlight. It comprises a glass substrate 302, an anode layer 304 deposited on the glass substrate 302, an organic hole transport layer 306 deposited on the anode layer 304, an electroluminescent polymer layer 308 deposited on the hole transport layer 306, and a continuous metallic cathode layer 310 deposited on the electroluminescent polymer layer 308. FIG. 6 shows a schematic plan view of a section of the anode layer as deposited on the glass substrate to illustrate the nature of the patterning of the anode layer 304. It comprises an ordered two-dimensional array of small sub-electrodes 320 arranged to form an array of parallel rows and columns. Each of the co-planar sub-electrodes is formed under a different portion of the hole transport layer 306. The dimension of the area of these sub-electrodes and the spacing between them is made small enough that a viewer of the light produced by the device cannot detect them under normal viewing conditions. Each of the sub-electrodes 320 is connected to those sub-electrodes directly adjacent to it in the same row and column by a fusible link 322. The material and dimensions of each fusible link are selected such that under normal operating conditions very little voltage is dropped across the fusible link, but such that, if subject to an anomalously high current (caused, for example, by a defect in the portion of the organic layers situated between the cathode and the sub-electrode), it will overheat and blow thereby isolating the defective site from the rest of the backlight, with a resulting improvement in the performance of the device.

The sub-electrodes of the anode and the fusible links can, for example, be made of indium-tin oxide (ITO). The patterned array formed by the sub-electrodes and fusible links can, for example, be formed by first depositing a continuous layer of ITO on the glass substrate and then selectively etching the continuous layer using for example, a photolithographical technique, to form the patterned array. Alternatively, the sub-electrodes and the fusible links may be made of different materials.

The cathode may additionally or alternatively be formed of sub-electrodes connected by fusible links in the same manner as described above for the anode. However, in the type of device described above in which the cathode layer is deposited on top of the relatively sensitive organic layers, care normally has to be taken not to cause undue damage to the underlying organic layers. For this reason, it is preferable that the patterned cathode layer be formed by deposition through a shadow mask rather than by an etching technique.

Figure 7:
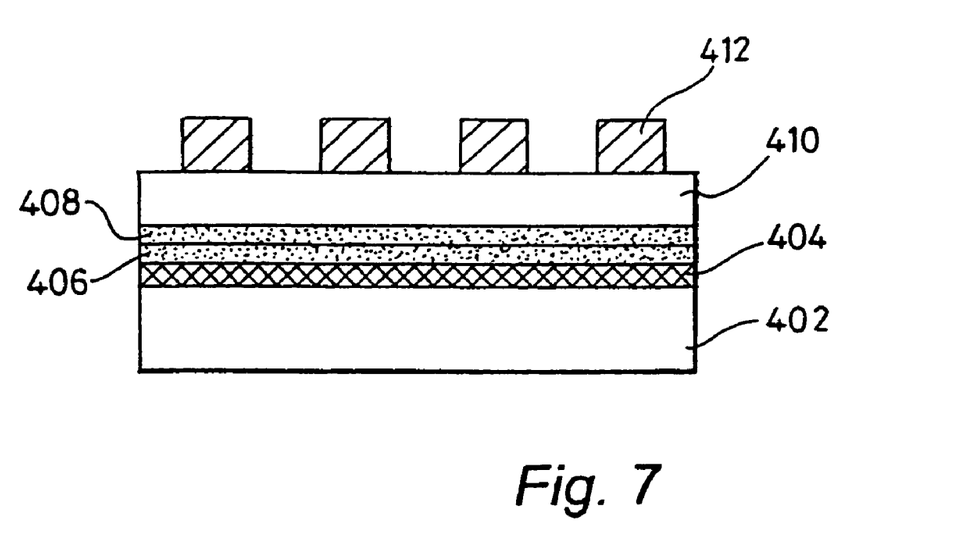
FIG. 7 is a cross-sectional view of a device according to another embodiment of the present invention.

Another embodiment of a light-emissive organic device according to the present invention is shown in FIG. 7. In this embodiment, a glass substrate 402 of thickness 1.1 mm is coated with indium tin oxide (ITO) 404, which has a sheet resistance of 15 Ohms/sq., to a thickness of 150 nm. This coating 404 of ITO is patterned to form a series of parallel rows using standard photolithographic and etch processes. A layer 406 of polyethylenedioxythiophene doped with polystyrene sulphonic acid (PEDT/PSS) is then formed on the ITO/glass substrate by spin-coating and baked at 150° C. to remove water leaving a layer 406 having a thickness of 50 nm. A layer 408 of light-emissive polymer is then deposited onto the layer 406 of PEDT/PSS also by spin coating. This layer could be a layer of a blend of 5% of poly(2,7-(9,9-di-n-octylfluorene)-3,6-(benzothiadiazole) and 95% of poly(2,7-(9,9-di-n-octylfluorene) (5BTF8) doped with poly(2,7-(9,9-di-n-octylfluorene-(1,4-phenylene-((1,4-phenylene-((4-secbutylphenyl)imino)-1,4-phenylene)) (TFB) and has a thickness of 75 nm. A layer 410 of a LiF/Al blend is then deposited on to the layer 408 of light-emissive polymer by the co-evaporation of LiF with Al in a vacuum chamber to form an ohmic contact on the light-emissive polymer layer 408. The LiF/Al blend layer 410 is deposited to a thickness sufficient to cover any defects on the surface of the light-emissive polymer layer 408. In the case that the device is prepared in a class 100 clean room, the thickness would be between 0.5 and 1 micron. An aluminium layer 412 is then deposited over the layer 410 of LiF/Al to a thickness of 0.5 microns, and is patterned using conventional photolithographic techniques to form a series of regularly spaced parallel columns running in a direction orthogonal to the series of parallel rows of ITO to thereby define a regular matrix of pixels where the series of ITO rows and Al columns spatially overlap with each other.

The LiF/Al physical blend is an isotropic conductor which conducts via a percolation mechanism wherein the resistivity of the blend is determined by the relative proportion of Al in the LiF/Al blend. The relative proportions of LiF and Al in the LiF/Al blend layer are determined according to the desired resistivity of the layer. The desired resistivity will of course vary according to the required thickness of the layer but is basically determined to provide a layer which is not so high in resistance that it leads to a significant increase in the drive voltage (since this will reduce the power efficiency of the device) but is high enough in resistance to ensure that crosstalk between adjacent columns is reduced to an insignificant level. The desired resistivity will therefore depend on several factors such as the number and spacing of the aluminium columns (which will depend on the desired resolution), the voltage at which each column is sequentially driven relative to adjacent columns, and the current density at which the device is to be operated.

Although a standard back-light LED is operated at a relative low current density of typically 1 mA/cm$^2$, the operating current density of a dot-matrix display LED will often be higher because, for example in a passive matrix device, the rows are driven sequentially. Typically, the higher current density will correspond to the unpulsed current density (the current density at which the device would be operated if it were to be used as a back-light device) multiplied by the number of rows which are sequentially driven. Therefore, a device having 100 rows will typically be operated at a current density of 100 mA/cm$^2$.

If the layer were to have a thickness of 0.5 microns, the resistivity of the LiF/Al blend could be up to 2×10$^4$ Ohm.cm without leading to an increase in drive voltage of greater than 0.1V, and if an increase in drive voltage of up to 1V were to be acceptable, the resistivity of the LiF/Al blend could be up to 2×10$^5$ Ohm.cm. If a layer having a thickness of 0.5 microns and a resistivity of 2×10 Ohm.cm were employed in a device in which the overlying aluminium layer and ITO anode layer were respectively patterned to form columns and rows each having a pitch of 1 mm, a spacing of 0.5 mm and a length of 50 mm, then the leakage current to the adjacent columns on either side of the driven column is only 0.5 $\mu$A (based on the supposition that the driven column is at 10V and the adjacent columns on either side of the driven column are earthed) compared to the current though the device of 250 $\mu$A when only a single pixel is lit.

The embodiment described above also has the advantage that the high-resistance layer between the aluminium layer and the light-emissive organic layer comprises a material, LiF, which contains a low work function element and thus aids the injection of electrons into the light-emissive polymer, thereby improving the performance of the device.

Figure 8:
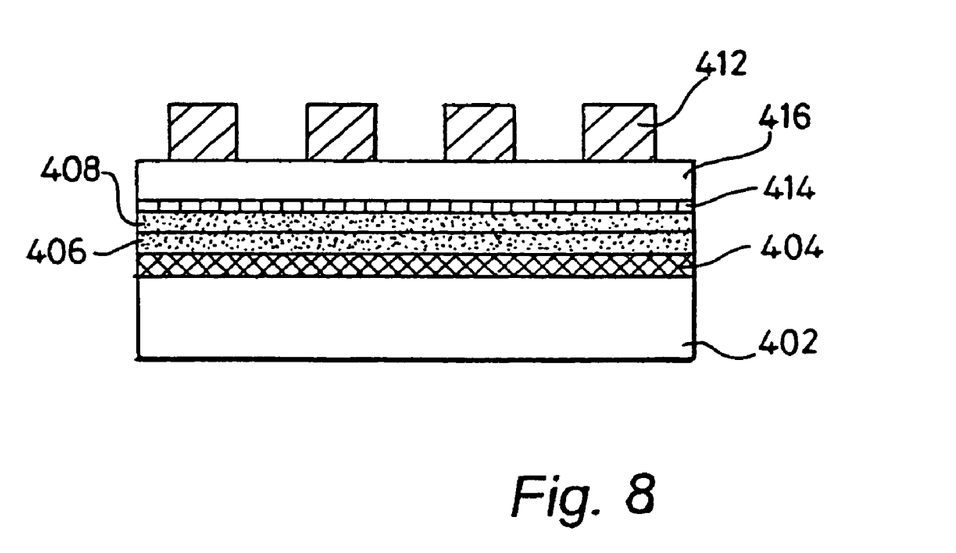
FIG. 8 is a cross-sectional view of a device according to another embodiment of the present invention.

Another embodiment of the organic light-emissive device according to the present invention is shown in FIG. 8. The device shown in FIG. 8 is identical to that shown in FIG. 7 with respect to the substrate, anode and organic layers, and identical reference numerals are used to denote identical components. The device shown in FIG. 8 differs from the device shown in FIG. 7 with respect to the construction of the cathode. The cathode comprises a layer 414 of lithium fluoride having a thickness of about 5 nm. This layer 414 can be deposited by any conventional deposition technique but is preferably deposited by a thermal evaporation technique to minimize the damage to the underlying organic layer. On top of this thin layer 414 of lithium fluoride is deposited a layer 416 of a semiconductor material such as a layer of a physical blend of lithium fluoride and aluminium to a thickness in the range of 0.5 to 1 micron. Next, a layer 412 of aluminium is deposited to a thickness of 0.5 microns on top of the layer 416 of lithium fluoride/aluminium blend to form an ohmic contact. This layer 412 of aluminium is then patterned using conventional patterning techniques to form a series of parallel columns running in a direction orthogonal to the series of anode rows. The relatively thick layer 16 of lithium fluoride/aluminium blend ensures the underlying organic layer is adequately protected from the patterning processes. The resistance of the aluminium/lithium fluoride blend layer 416 is such that it does not raise the operating voltage of the device by an; intolerable degree whilst still preventing lateral current leakage (cross-talk) between adjacent cathode columns. The provision of a thin layer 414 of lithium fluoride adjacent the light-emissive organic region enhances the injection of electrons from the cathode into the light-emissive organic region.

Although the embodiments shown in FIGS. 7 and 8 show the use of a high-resistance electrode layer with a patterned cathode, it could equally be used together with a patterned anode in the case that an OLED is produced by first forming a patterned cathode on a glass substrate, depositing one or more layers of organic material on the cathode, and finally forming an anode on the uppermost layer of organic material. In the case of an anode, it is preferred that the electrode layer adjacent the light-emissive organic region comprises at least one element having a high work function to enhance the injection of positive charge carriers (holes) into the light-emissive organic region from the anode.

What is claimed is:

1. A light-emissive device comprising first and second electrode layers and one or more layers including a layer of light-emissive material arranged between the first and second electrode layers such that charge carriers can move between the first and second electrode layers and the light-emissive material, wherein at least the first electrode layer comprises a plurality of sub-electrodes, each sub-electrode being connected to each of any sub-electrodes directly surrounding it via a fusible link, each fusible link adapted to break and electrically isolate the respective sub-electrode from the other sub-electrodes when subject to an anomalously high current caused by a defect in a portion of the one or more layers situated between the second electrode and the respective sub-electrode.

2. A light-emissive device according to claim 1 wherein the plurality of sub-electrodes are arranged to create an ordered array of parallel rows and columns, and each of the sub-electrodes is connected via a fusible link to each of any sub-electrodes directly adjacent to it in the same column and row.

3. A light-emissive device according to claim 1 wherein the size and spacing of the sub-electrodes is selected such that, during operation of the device, the light emitted by the light-emissive device appears to the human eye to be continuous in intensity across the whole area of light emission.

4. A light-emissive device comprising a layer of light-emissive material arranged between first and second electrode layers such that charge carriers can move between the first and second electrode layers and the light-emissive material, wherein at least the first electrode layer comprises a plurality of sub-electrodes, each sub-electrode being connected to each of any sub-electrodes directly surrounding it via a fusible link, the fusible link being of smaller dimensions than the sub-electrodes.

* * * * *